United States Patent [19]

Burton et al.

[11] Patent Number: 4,825,108

[45] Date of Patent: Apr. 25, 1989

[54] VOLTAGE TRANSLATOR WITH RESTRICTED OUTPUT VOLTAGE SWING

[75] Inventors: Edward A. Burton, Provo; Charles E. Dike, Pleasant Grove; Thomas D. Fletcher, Orem, all of Utah

[73] Assignee: North American Philips Corporation, Signetics Division, Sunnyvale, Calif.

[21] Appl. No.: 63,569

[22] Filed: Jun. 15, 1987

[51] Int. Cl.⁴ .................. H03K 19/092; H03K 17/04; H03K 17/60; H03K 19/088

[52] U.S. Cl. .................... 307/475; 307/456; 307/458; 307/551; 307/544; 307/559; 307/560

[58] Field of Search .............. 307/551, 559, 566, 561, 307/544, 557, 558, 560, 443, 475, 456, 457, 458

[56] References Cited

U.S. PATENT DOCUMENTS

| | | | |
|---|---|---|---|
| 3,259,761 | 7/1966 | Narud et al. | 307/455 |
| 3,560,760 | 2/1971 | Chung et al. | 307/456 |
| 3,742,250 | 6/1973 | Kan | 307/457 X |
| 3,755,693 | 8/1973 | Lee | 307/455 |
| 3,778,646 | 12/1973 | Masaki | 307/455 |
| 3,987,310 | 10/1976 | Peltier et al. | 307/458 |
| 4,394,588 | 7/1983 | Gaudenzi | 307/443 |
| 4,501,976 | 2/1985 | West et al. | 307/456 |
| 4,536,664 | 8/1985 | Martin | 307/544 X |
| 4,749,885 | 6/1988 | Gal | 307/456 |

FOREIGN PATENT DOCUMENTS

| | | | |
|---|---|---|---|
| 0037930 | 3/1982 | Japan | 307/457 |
| 8501165 | 3/1985 | PCT Int'l Appl. | 307/456 |

OTHER PUBLICATIONS

"TTL Logic Data Manuel", Signetic Corp., pp. 2-1 and 2-3.

Primary Examiner—Stanley D. Miller
Assistant Examiner—David R. Bertelson
Attorney, Agent, or Firm—R. Meetin; D. Treacy; T. Briody

[57] ABSTRACT

A voltage translator containing a bipolar transistor (Q1), a rectifier (10), a resistor (R1), and a first clamp (12) converts an input voltage ($V_I$) into one or more output voltages of restricted voltage swing. The first clamp clamps the emitter voltage of the transistor when it is turned on. In one version, the translator includes a second clamp (14) that clamps the collector voltage of the translator when it is turned off. The translator then provides an output voltage ($\overline{V}_O$) inverse to the input voltage. In another version, the first clamp is connected between a voltage supply ($V_{EE}$) and the emitter of the transistor. Its collector is connected directly to another voltage supply ($V_{CC}$) so that the translator only makes non-inverting translations.

25 Claims, 4 Drawing Sheets

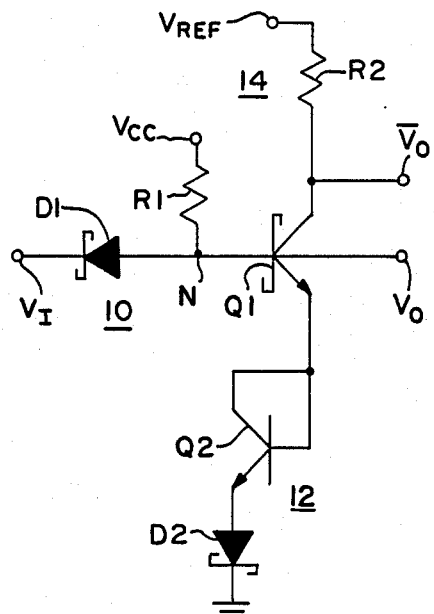
Fig. 4a
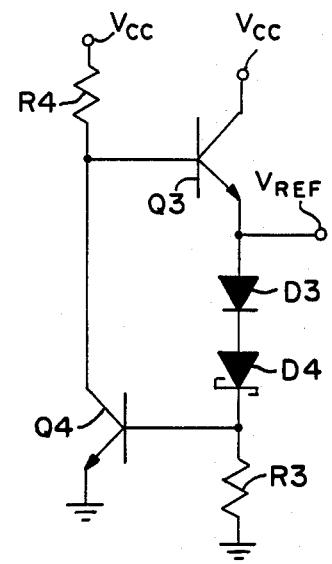
Fig. 5
Fig. 4b

VOLTAGE TRANSLATOR WITH RESTRICTED OUTPUT VOLTAGE SWING

FIELD OF USE

This invention relates to voltage translators suitable for use in semiconductor integrated circuits.

BACKGROUND ART

Transistor-transistor logic (TTL) is one of the prevalent types of bipolar logic employed in integrated circuits. Although the definition of TTL has become blurred over the years due to the practice of merging TTL with other types of bipolar logic while still terming the result "TTL", TTL continues to be a "ground-referenced" logic. A TTL device typically changes state when the input voltage passes $2V_{BE}$ with respect to ground reference (0 volt). $V_{BE}$ is the standard voltage of about 0.7–0.8 volt across the base-emitter junction of an NPN transistor when it is just conductive.

Referring to FIG. 1, it illustrates the basic features of a conventional "TTL" inverter. The operation of this device is very well known. For example, see U.S. Pat. Nos. 3,824,408 and 4,321,490. Accordingly, only a few pertinent comments will be made about it.

All of the transistors shown in FIG. 1 are NPN devices. Certain of the transistors are Schottky clamped to prevent the so clamped transistors from going into deep saturation. An NPN transistor is Schottky clamped by connecting a Schottky diode between its base and collector as indicated in FIG. 2. Returning to FIG. 1, power is supplied to resistors RA, RB, and RC from a source of a supply voltage $V_{CC}$ which is at a suitable high level relative to ground.

Assume that input voltage $V_{IN}$ at the inverter input terminal is initially at a low value less than $2V_{BE}$ above ground. PN input diode DA is turned on so that input transistor QA, phase-splitting transistor QB, and low-level drive transistor QC are all turned off. The high-level driver is turned on to pull output voltage $V_{OUT}$ up to a logical "1" somewhat below $V_{CC}$.

When input $V_{IN}$ is increased, the voltage at node A between the DA anode and the QA base also increases. Transistors QA, QB, and QC turn on when $V_{IN}$ reaches about $2V_{BE}$ above ground. Due to the $1V_{BE}$ across the base-emitter junction of each of transistors QB and QC, they clamp the QA emitter voltage at $2V_{BE}$ above ground. QA then similarly clamps node A at $3V_{BE}$ above ground. A further increase in $V_{IN}$ causes diode DA and the high-level driver to turn off. Transistor QC pulls output $V_{OUT}$ to a logical "0" near ground. The reverse events occur when $V_{IN}$ is subsequently returned to a low value. If $V_{CC}$ is 5 volts, the $V_{OUT}$ swing is usually about 3 volts.

The output signal of a TTL gate is often supplied to a circuit employing another type of "ground-referenced" logic. In some cases, the TTL output voltage swing is too great for the non-TTL circuit. If the TTL output drives a circuit using a non-saturating logic such as ground-referenced emitter-coupled logic or current-tree logic, a relatively high TTL output swing can force the normally non-saturating transistors into saturation. The result is a loss in speed, which may be accompanied by a loss in data and/or excessive power dissipation. It would be desirable to have a simple device that can make rapid translations from the output voltage levels of a TTL circuit to a "ground-referenced" voltage level at a lesser voltage swing.

DISCLOSURE OF THE INVENTION

The present invention is a voltage translator that converts an input voltage supplied at an input terminal into one or more output voltages of restricted voltage swing. The translator centers around a bipolar transistor having a base coupled to a node, an emitter coupled to a source of a first supply voltage, and a collector coupled to a source of a second supply voltage. The two supply voltages differ in magnitude from each other by a selected voltage $V_{PS}$ which is the overall power supply voltage. A rectifier is coupled between the input terminal and the foregoing node in the current-flow direction opposite to that of the base-emitter junction of the transistor. A resistor is coupled between the node and the source of the second supply voltage. The translator contains a first clamp that operates on the voltage at the emitter. When the transistor is turned on, the first clamp prevents the magnitude of the difference between the first supply voltage and the emitter voltage from exceeding a first clamped value $V_{CL1}$ that is less than $V_{PS}$.

In one aspect of the invention, the translator is characterized by a second clamp that operates on the voltage at the collector. When the transistor is turned off, the second clamp prevents the magnitude of the difference between the first supply voltage and the collector voltage from exceeding a second clamped value $V_{CL2}$ that is less than $V_{PS}$ but greater than $V_{CL1}$. An output voltage logically inverse to the input voltage is provided from an output terminal coupled to the collector. An output voltage logically the same as the input voltage is usually provided from an input terminal coupled to either the base or the emitter. The translator thereby supplies complementary output voltages.

The transistor is preferably an NPN device. The second supply voltage is then at a high level, while the first supply voltage is at a low level, preferably ground potential. In this case, the upward swings of the output voltages are clamped at levels referenced to ground. Clamping the output voltages in this way avoids noise-margin problems that would otherwise result from variations in the second supply voltage.

By suitably choosing $V_{CL1}$ and $V_{CL2}$, the output voltage swings can be made significantly less than that in the prior art TTL inverter described above. Consequently, the present translator can be employed to convert a relatively large TTL output voltage swing into a reduced swing suitable for a circuit using a ground-referenced logic.

Complementary output voltages are not needed in some applications. Accordingly, in another aspect of the invention, the second clamp is replaced with a direct connection of the collector to the source of the second supply voltage. No output terminal is coupled to the collector since it is now maintained at the second supply voltage. However, the output terminal coupled to the base or the emitter is retained to provide a non-inverting translation.

The present voltage translator operates at high speed but low power. The design is simple. Consequently, the invention is a very useful component for an integrated circuit using multiple types of logic.

BRIEF DESCRIPTION OF THE DRAWINGS

FIG. 2 illustrates the convention in which the base of the transistor reference symbol is formed in the shape of a long block "S" to represent the presence of the clamping Schottky diode which is not actually shown.

FIGS. 4a, 4b, 4c, 4d, and 4e are circuit diagrams of embodiments of the translator of FIG. 3.

FIG. 5 is a circuit diagram of a voltage reference circuit used with the embodiment of FIG. 4a.

Like reference symbols are employed in the drawings and in the description of the preferred embodiments to represent the same or very similar item or items.

DESCRIPTION OF THE PREFERRED EMBODIMENTS

Figure 1:
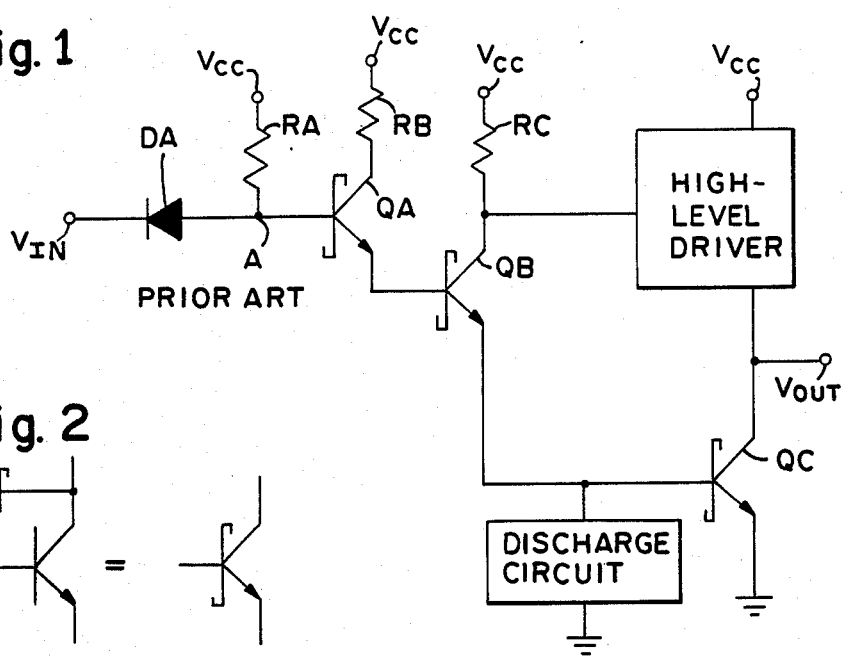
FIG. 1 is a circuit diagram of a prior art TTL inverter.
Figure 2:
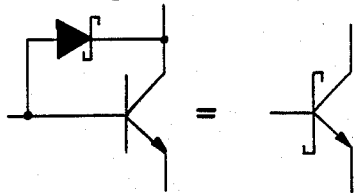
FIG. 2 is a circuit diagram of a Schottky clamped NPN transistor.
Figure 3:
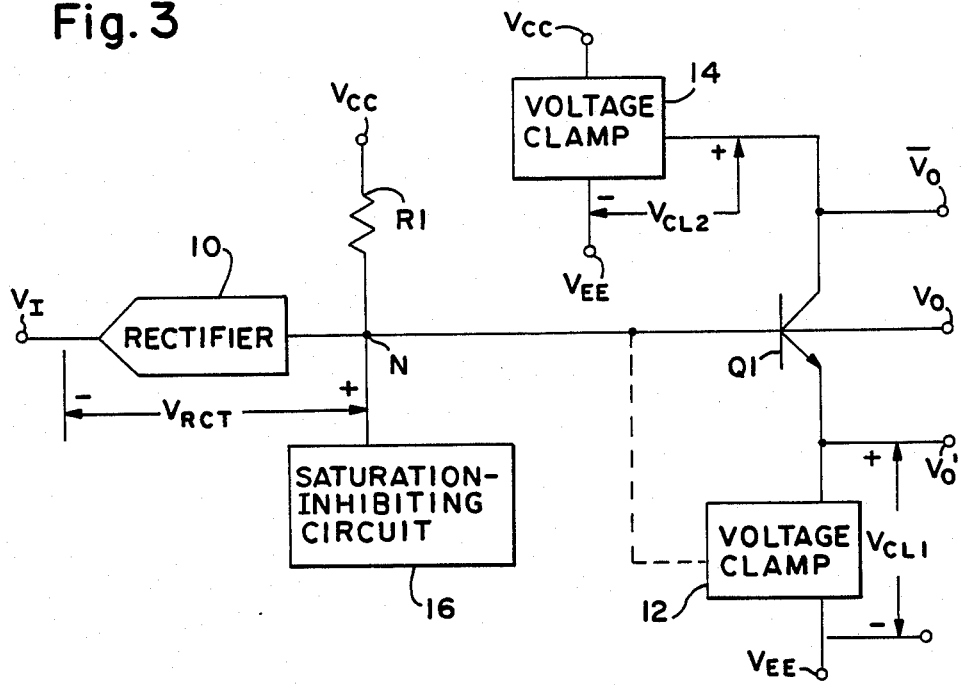
FIG. 3 is a block/circuit diagram of a voltage translator in accordance with the invention.

FIG. 3 illustrates a general bipolar voltage translator that converts an input voltage $V_I$ into an output voltage $\overline{V}_O$ as the logical inverse of input $V_I$. The translator may also produce one or both of output voltages $V_O$ and $V_O'$ at the same logical value as input $V_I$. Output $V_O'$ is at a lower voltage level than output $V_O$. The maximum (voltage) values of outputs $\overline{V}_O$, $V_O$, $V_O'$ are all "referenced" to a low voltage supply $V_{EE}$ which is typically, though not necessarily, ground potential. If $V_I$ has a relatively large voltage swing, the translator can generally produce $\overline{V}_O$, $V_O$, and $V_O'$ with considerably reduced voltage swing.

Voltages $\overline{V}_O$, $V_O$, and $V_O'$ are supplied from output terminals respectively connected to the collector, base, and emitter of an NPN transistor Q1 in the translator. The Q1 base is connected through a node N to one end of a current rectifier 10 whose other end is connected to an input terminal at which voltage $V_I$ is received. Rectifier 10 is oriented so as to conduct current in the current-flow direction opposite to that of the Q1 base-emitter junction. That is, if rectifier 10 is a diode, its anode is connected to node N while its cathode is connected to the $V_I$ terminal. A substantially fixed voltage $V_{RCT}$ exists across rectifier 10 when it is fully conductive. A resistor R1 is connected between node N and the source of high supply voltage $V_{CC}$. The power supply voltage $V_{PS}$ for the translator is $V_{CC} - V_{EE}$.

A voltage clamp 12 is connected between the Q1 emitter and the $V_{EE}$ supply. When transistor Q1 is turned on, clamp 12 prevents the voltage at the Q1 emitter from rising more than a specified value $V_{CL1}$ above $V_{EE}$. $V_{CL1}$ is less than $V_{PS}$. More particularly, clamp 12 substantially clamps the Q1 emitter voltage at $V_{CL1} + V_{EE}$ when transistor Q1 is conductive. The voltage at the Q1 base is similarly clamped at $V_{CL1} + V_{EE} + V_{BE}$ since $1 V_{BE}$ exists across the base-emitter junction of transistor Q1 when it is turned on. The clamped values of the Q1 emitter and base voltages are substantially independent of whether voltage $V_I$ is changing or not as long as it is high enough to place transistor Q1 in the conductive state. Clamp 12 may also be connected to the Q1 base to stabilize the clamping action.

A voltage clamp 14 is connected between the Q1 collector and the $V_{EE}$ supply. When transistor Q1 is turned off, clamp 14 prevents the voltage at the Q1 collector from rising more than a specified value $V_{CL2}$ above $V_{EE}$. More precisely, clamp 14 substantially clamps the Q1 collector voltage at $V_{CL2} + V_{EE}$ when voltage $V_I$ is low enough to place transistor Q1 in the non-conductive state. $V_{CL2}$ is less than $V_{PS}$ but greater than $V_{CL1}$. Clamp 14 is also connected to the $V_{CC}$ supply to provide current for transistor Q1.

A saturation-inhibiting circuit 16 is connected to node N. When transistor Q1 is fully conductive, circuit 16 limits the Q1 collector-to-emitter voltage to a minimum value $V_{CE}$ which is typically several tenths of a volt. This increases the translator speed by preventing transistor Q1 from going into deep saturation.

Noting that output $\overline{V}_O$ is the Q1 collector voltage, $\overline{V}_O$ reaches a maximum value of $V_{CL2} + V_{EE}$ when transistor Q1 is off. $\overline{V}_O$ drops to a minimum value of $V_{CL1} + V_{CE} + V_{EE}$ when transistor Q1 is turned on. Consequently, the upward and downward $\overline{V}_O$ swings are both clamped at levels referenced to $V_{EE}$. The total $\overline{V}_O$ swing is $V_{CL2} - V_{CL1} - V_{CE}$.

Similarly noting that outputs $V_O$ and $V_O'$ respectively are the Q1 base and emitter voltages, $V_O$ and $V_O'$ respectively reach maximum values of $V_{CL1} + V_{BE} + V_{EE}$ and $V_{CL1} + V_{EE}$ when transistor Q1 is turned on. That is, the upward voltage swings of $V_O$ and $V_O'$ are clamped at levels referenced to $V_{EE}$. $V_O$ and $V_O'$ drop to their minimum values when transistor Q1 is turned off. $V_I$ typically cannot drop below $V_{EE}$. As a result, the minimum value of $V_O$ is at least $V_{RCT} + V_{EE}$.

The translator of FIG. 3 operates as follows. Assume that input $V_I$ is initially at its lowest value $V_{IMIN}$. Rectifier 10 is turned on. Output $V_O$, which is also the voltage at node N, equals $V_{RCT} + V_I$. $V_{RCT}$ is chosen to have a sufficiently low value that transistor Q1 is turned off. Clamp 12 and circuit 16 are inactive. Clamp 14 is active and clamps output $\overline{V}_O$ at the high level given above. $\overline{V}_O$ exceeds both $V_O$ and $V_O'$.

$V_I$ is now increased. A point is eventually reached at which transistor Q1 starts to turn on. Clamp 12 becomes active and clamps outputs $V_O$ and $V_O'$ at the above-cited values. Clamp 14 provides transistor Q1 with current but ceases to clamp output $\overline{V}_O$ which drops below $V_O$. Circuit 16 also becomes active to prevent the voltage between the collector and emitter of transistor Q1 from dropping below $V_{CE}$. Output $\overline{V}_O$ is then clamped at its low level as a result of the interaction among components Q1, 12, and 16. A further increase in $V_I$ causes rectifier 10 to turn off. The opposite events occur when $V_I$ is later decreased.

FIGS. 4a-4e illustrate five embodiments of the voltage translator of FIG. 3. These embodiments have many similarities. Accordingly, the embodiments of FIGS. 4a-4e will be described as a group as much as possible.

Rectifier 10 is implemented with a Schottky diode D1 in all of FIGS. 4a-4e. The D1 anode and cathode are respectively connected to node N and the $V_I$ terminal. $V_{RCT}$ thereby equals $V_S$, where $V_S$ is the standard voltage of about 0.4-0.6 volt across a Schottky diode when it is fully conductive.

Clamp 12 consists of an NPN transistor Q2 and a Schottky diode D2 in all of FIGS. 4a-4e. Transistor Q2 has its base and emitter respectively connected to the Q1 emitter and the D2 anode. The D2 cathode is connected to the $V_{EE}$ supply which is ground reference here. The clamping action is provided by diode D2 and the diode formed by the Q2 base-emitter junction. Elements Q2 and D2 are turned on whenever transistor Q1 is turned on, and vice versa. $V_{CL1}$ thus equals $V_{BE}+V_S$.

The preceding discussion completes the description of the items common to all the embodiments of FIGS. 4a–4e. The differences among these embodiments are examined next.

Figure 4C:
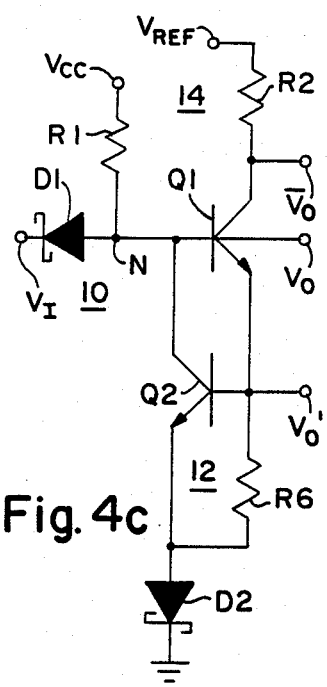
Figure 4D:
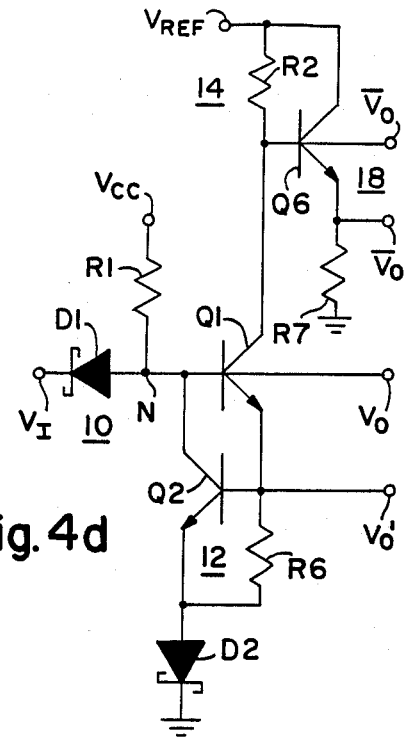
Figure 4E:
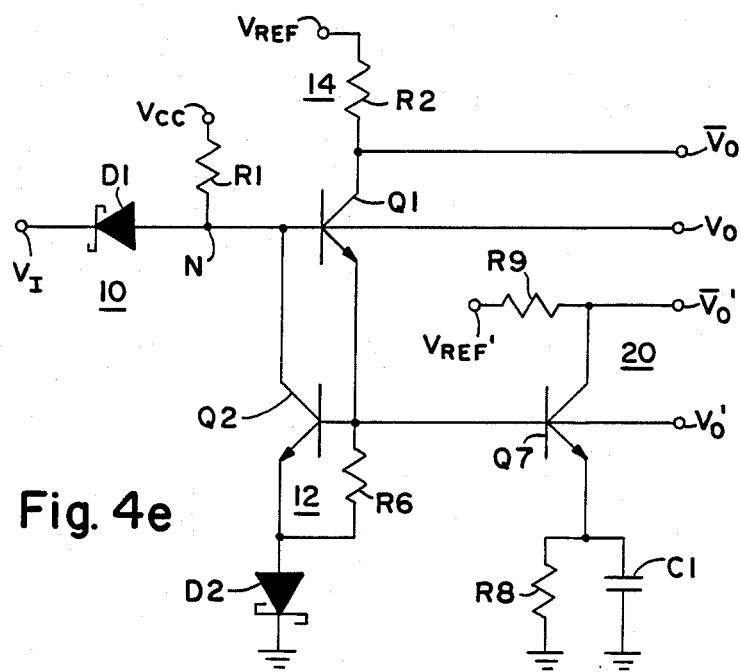

The following items apply to FIGS. 4a and 4b but not to FIGS. 4c–4e. Transistor Q2 is arranged as a diode in FIGS. 4a and 4b by connecting its collector back to its base. Circuit 16 is implemented by Schottky clamping transistor Q1. Excess R1 current that would otherwise flow through the Q1 base-collector junction thereby flows through the Schottky diode to keep transistor Q1 from going into deep saturation. The embodiments of FIGS. 4a and 4b provide complementary outputs $\overline{V}_O$ and $V_O$ but not output $V_O'$.

In FIG. 4a, clamp 14 is implemented with (1) a voltage reference circuit that provides a reference terminal with a reference voltage $V_{REF}$ substantially equal to the desired value of $V_{CL2}$ and (2) a resistor R2 connected between the Q1 collector and the reference terminal. The voltage reference circuit may be of conventional design. FIG. 5 depicts a preferred embodiment of the reference circuit in which it consists of NPN transistors Q3 and Q4, resistors R3 and R4, a PN diode D3, and a Schottky diode D4 arranged as shown. Elements Q3, Q4, D3, and D4 are always conductive (as long as the translator is powered). $V_{REF}$ is equal to $2V_{BE}+V_S$ by virtue of the voltage drops across diodes D3 and D4 and the Q4 base-emitter junction. Current for transistor Q1 is provided from the $V_{CC}$ supply via elements Q3 and R2.

In an oxide-isolated first-generation integrated circuit, each of resistors R1, R2, R3, and R4 is typically 10,000 ohms in the composite embodiment of FIGS. 4a and 5. $V_{CC}$ is about 5 volts.

Appropriately combining the various voltage relationships given above leads to the following for the translator of FIGS. 4a and 5. Output $\overline{V}_O$ swings between a high clamped value of $2V_{BE}+V_S$ (about 2.0 volts) relative to ground and a low clamped value of $2V_{BE}$ (about 1.5 volts) relative to ground. The $\overline{V}_O$ swing is $1V_S$ (about 0.5 volt). $V_O$ swings between a high value of $2V_{BE}+V_S$ (again about 2.0 volts) relative to ground and a low value that is $1V_S$ (again about 0.5 volt) above $V_{IMIN}$. These swings are particularly suitable for driving a circuit using ground-referenced current tree logic or emitter-coupled logic.

Input $V_I$ is typically supplied as the output of a circuit such as the TTL inverter discussed above. Since the TTL circuit has an output voltage swing of about 3 volts when $V_{CC}$ is about 5 volts, the embodiment of FIGS. 4a and 5 reduces the output voltage swing considerably.

Moving to FIG. 4b, clamp 14 consists of (1) elements Q2 and D2, (2) an NPN transistor Q5 connected as a diode between the Q2 base and the Q1 collector, and (3) a resistor R5 connected between the Q1 emitter and the $V_{CC}$ supply. Elements Q2 and D2 are thereby used in both of clamps 12 and 14. By inspection, $V_{CL2}$ equals $2V_{BE}+V_S$.

In FIG. 4c, $\overline{V}_O$, $V_O$, and $V_O'$ are all supplied as outputs. As in FIG. 4a, clamp 14 is implemented with resistor R2 and a voltage reference circuit that generates voltage $V_{REF}$ at a value substantially equal to $V_{CL2}$. The circuit of FIG. 5 could again be used as the reference circuit.

A resistor R6 is connected between the Q1 emitter and the D2 anode in FIG. 4c. The Q2 collector is connected back to the Q1 base. This connection provides a path for diverting excess R1 current through elements Q2 and D2 to ground so that the R6 current approximately equals the R2 current. $V_{CE}$ is thereby approximately equal to $V_{REF}-V_{CL1}-(R_2/R_6)V_{BE}$ where $R_2/R_6$ is the ratio of resistor R2 to resistor R6. By suitably choosing $R_2/R_6$, $V_{CE}$ can be set at several tenths of a volt to keep transistor Q1 out of deep saturation. Consequently, circuit 16 of FIG. 3 is implemented here with elements Q2, D2, R2, and R6 plus the reference circuit.

The embodiment of FIG. 4d contains all the elements of FIG. 4c plus a circuit 18 having an output terminal that provides an output voltage $\overline{V}_O'$ logically inverse to input $V_I$. $\overline{V}_O'$ is at a lower voltage level than $\overline{V}_O$. Circuit 18 consists of an NPN transistor Q6 and a resistor R7 connected as shown. Transistor Q6 is always turned on (as long as the translator is powered). As a result, output $\overline{V}_O'$ is clamped at a high value referenced to ground when transistor Q1 is turned off.

The embodiment of FIG. 4e includes all the elements of FIG. 4c plus a circuit 20 that generates output $\overline{V}_O'$ in a different way than in FIG. 4d. Circuit 20 contains an NPN transistor Q7, a resistor R8, and a capacitor C1 arranged as shown. A resistor R9 is connected between the Q7 collector and a reference terminal that receives another reference voltage $V_{REF}'$ referenced to ground. A suitable voltage reference circuit (not shown) generates voltage $V_{REF}'$. Transistor Q7 turns off when transistor Q1 turns off, and vice versa. Output $\overline{V}_O'$ is thereby again clamped at high level referenced to ground when transistor Q1 is turned off.

Figure 6:
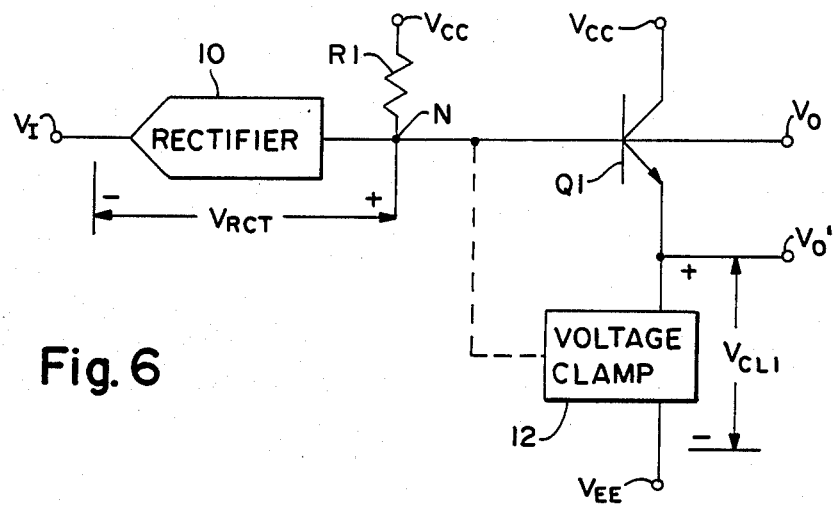
FIG. 6 is a block/circuit diagram of another voltage translator in accordance with the invention.

FIG. 6 illustrates another general bipolar voltage translator that converts input $V_I$ into one or both of outputs $V_O$ and $V_O'$ of the same logical polarity as input $V_I$. Outputs $V_O$ and $V_O'$ in FIG. 6 have the characteristics described above for FIG. 3.

The translator of FIG. 6 contains components Q1, 10, R1, and 12 arranged and operable in the same manner as described above for FIG. 3. The major difference between FIGS. 3 and 6 is that the Q1 collector is connected directly to the $V_{CC}$ supply in the translator of FIG. 6. This connection prevents transistor Q1 from saturating. However, the direct connection of the Q1 collector to the $V_{CC}$ supply also means that an output voltage inverse to input $V_I$ is not available from the Q1 collector. The translator is a non-inverting device.

Figure 7A:
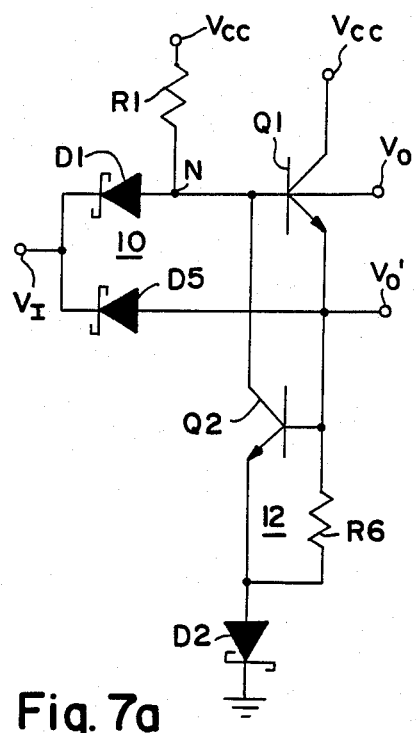
FIGS. 7a and 7b are circuit diagrams of embodiments of the translator of FIG. 6.
Figure 7B:
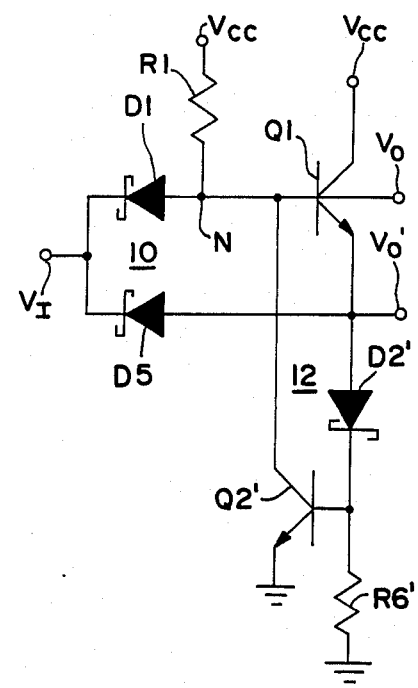

FIGS. 7a and 7b illustrate two embodiments of the voltage translator of FIG. 6. In both embodiments, rectifier 10 is implemented with diode D1. A Schottky diode D5 is connected between the $V_I$ and $V_O$ terminals. If there is a large output capacitance, diode D5 helps discharge the capacitance when input $V_I$ is low.

In FIG. 7a, clamp 12 consists of elements Q2 and D2 arranged and operable as described above for FIG. 4c. The connection of the Q2 collector to the Q1 base again provides a path for diverting excess R1 current to ground. Resistor R6 sets the Q1 collector-emitter current. Resistor R6 could be tied directly to ground instead of being connected to the D2 anode.

In FIG. 7b, clamp 12 is formed by an NPN transistor Q2', a Schottky diode D2', and a resistor R6' arranged as shown. The positions of elements Q2' and D2' in FIG. 7b are reversed from the positions of elements Q2 and D2 in FIG. 7a. This reversal does not effect the value of $V_{CL1}$. It still equals $V_{BE}+V_S$.

While the invention has been described with reference to particular embodiments, this description is solely for the purpose of illustration and it is not to be construed as limiting the scope of the invention claimed below. For example, elements of opposite polarity to those described above could be employed to achieve largely the same results. Circuits of the type that generate additional output $\overline{V}_O'$ could be utilized to produce further output voltages at levels different from those of $\overline{V}_O$, $V_O$, $V_O'$, and $\overline{V}_O'$. Thus, various modifications, changes, and applications may be made by those skilled in the art without departing from the true scope and spirit of the invention as defined by the appended claims.

We claim:

1. A voltage translator comprising:
   an input terminal for receiving an input voltage;
   a bipolar transistor having a base coupled to a node, an emitter coupled to a source of a first supply voltage, and a collector directly connected to a source of a second supply voltage that differs in magnitude from the first supply voltage by a selected voltage $V_{PS}$;
   a rectifier coupled between the input terminal and the node in the current-flow direction opposite to that of the base-emitter junction of the transistor;
   a resistor coupled between the node and the source of the second supply voltage;
   a clamp that, when the transistor is turned on, prevents the magnitude of the difference between the first supply voltage and the voltage at the emitter from exceeding a value $V_{CL1}$ less than $V_{PS}$ but greater than zero;
   an output terminal coupled to the base for providing an output voltage logically the same as the input voltage; and
   an output terminal coupled to the emitter for providing an output voltage logically the same as the input voltage but at a different voltage level from the other output voltage.

2. A voltage translator comprising:
   an input terminal for receiving an input voltage;
   a bipolar transistor having a base coupled to a node, an emitter coupled to a source of a first supply voltage, and a collector coupled to a source of a second supply voltage that differs in magnitude from the first supply voltage by a selected voltage $V_{PS}$;
   a rectifier coupled between the input terminal and the node in the current-flow direction opposite to that of the base-emitter junction of the transistor;
   a resistor coupled between the node and the source of the second supply voltage;
   a first clamp that, when the transistor is turned on, prevents the magnitude of the difference between the first supply voltage and the voltage at the emitter from exceeding a value $V_{CL1}$ less that the $V_{PS}$ but greater than zero;
   a second clamp that, when the transistor is turned off, prevents the magnitude of the difference between the first supply voltage and the voltage at the collector from exceeding a value $V_{CL2}$ less than $V_{PS}$ but greater than $V_{CL1}$; and
   an output terminal coupled to the collector for providing an output voltage logically inverse to the input voltage.

3. A translator as in claim 2 further including an output terminal coupled to one of the base and the emitter for providing an output voltage logically the same as the input voltage.

4. A translator as in claim 3 further including an output terminal coupled to the other of the base and the emitter for providing another output voltage logically the same as the input voltage.

5. A translator as in claim 4 further including means having an output terminal for providing another output voltage logically inverse to the input voltage but at a different voltage level from that of the first-mentioned output voltage.

6. A translator as in claim 3 further including means for preventing the transistor from going into deep saturation.

7. A translator as in claim 3 wherein the transistor is an NPN transistor.

8. A translator as in claim 7 wherein the rectifier comprises a diode having its anode and cathode respectively connected to the node and the input terminal.

9. A translator as in claim 8 wherein the first clamp comprises a pair of further diodes connected in series such that one has its anode connected to the emitter and the other has its cathode connected to the source of the first supply voltage.

10. A translator as in claim 9 wherein: the first-mentioned diode and one of the further diodes are Schottky diodes; and the other further diode is a base-emitter junction of a second NPN bipolar transistor.

11. A translator as in claim 9 wherein the second clamp comprises:
    means for providing a reference terminal with a reference voltage substantially equal to $V_{CL2}$; and
    a second resistor coupled between the collector and the reference terminal.

12. A translator as in claim 9 wherein the second clamp comprises:
    at least one diode connected in series between the emitter and the collector; and
    a second resistor coupled between the collector and the source of the second supply voltage.

13. A translator as in claim 8 wherein the first clamp comprises:
    a second NPN bipolar transistor having a base connected to the emitter of the first-mentioned transistor, an emitter, and a collector; and
    a second diode having its anode and cathode respectively coupled to the emitter of the second transistor and the source of the first supply voltage.

14. A translator as in claim 13 wherein the second clamp comprises:
    means for providing a reference terminal with a reference voltage substantially equal to $V_{CL2}$; and
    a second resistor coupled between the collector and the reference terminal.

15. A translator as in claim 14 wherein the collector of the second transistor is connected to the base of the first-mentioned transisitor.

16. A voltage translator comprising:
    an input terminal for receiving an input voltage;
    a bipolar transistor having a base coupled to a node, an emitter coupled to a source of a first supply voltage, and a collector directly connected to a source of a second supply voltage that differs in magnitude from the first supply voltage by a selected voltage $V_{PS}$;

a rectifier coupled between the input terminal and the node in the current-flow direction opposite to that of the base-emitter junction of the transistor;

a resistor coupled between the node and the source of the second supply voltage;

a clamp that, when the transistor is turned on, prevents the magnitude of the difference between the first supply voltage and the voltage at the emitter from exceeding a value $V_{CL1}$ less than $V_{PS}$ but greater than zero, the clamp connected between the emitter and the source of the first supply voltage; and an output terminal coupled to one of the base and the emitter for providing an output voltage logically the same as the input voltage.

17. A translator as in claim 16 further including an output terminal coupled to the other of the base and the emitter for providing an output voltage logically the same as the input voltage but at a different voltage level from the other output voltage.

18. A translator as in claim 16 wherein the transistor is an NPN transistor.

19. A translator as in claim 18 wherein:

the rectifier comprises a first diode having its anode and cathode respectivly coupled to the node and the input terminal; and the clamp comprises a pair of further diodes connected in series such that one has its anode connected to the emitter and the other has its cathode connected to the source of the first supply voltage.

20. A translator as in claim 19 wherein one of the further diodes is the base-emitter junction of a second NPN bipolar transistor having a collector connected to the base of the first-mentioned transistor.

21. A translator as in claim 20 wherein the first-mentioned diode and the other of the further diodes are Schottky diodes.

22. A translator as in claim 2 wherein the rectifier is connected directly to the base by way of the node.

23. A translator as in claim 10 wherein the second clamp comprises:

means for providing a reference terminal with a reference voltage substantially equal to $V_{CL2}$; and a second resistor coupled between the collector and the reference terminal.

24. A translator as in claim 10 wherein the second clamp comprises:

at least one diode connected in series between the emitter and the collector; and a second resistor coupled between the collector and the source of the second supply voltage.

25. A translator as in claim 16 wherein the rectifier is connected directly to the base by way of the node.

* * * * *